US008369140B2

(12) United States Patent
Yeh et al.

(10) Patent No.: US 8,369,140 B2
(45) **Date of Patent: *Feb. 5, 2013**

(54) SYSTEMS AND METHODS FOR PROGRAMMING A MEMORY DEVICE

(75) Inventors: Chih-Chieh Yeh, Taipei (TW); Wen-Jer Tsai, Hualien (TW); Yi-Ying Liao, Sijhih (TW)

(73) Assignee: Macronix International Co., Ltd. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 12/018,709

(22) Filed: Jan. 23, 2008

(65) Prior Publication Data

US 2008/0144371 A1 Jun. 19, 2008

Related U.S. Application Data

(62) Division of application No. 11/248,504, filed on Oct. 12, 2005, now Pat. No. 8,223,553.

(51) Int. Cl.
*G11C 11/34* (2006.01)

(52) U.S. Cl. .................................................. 365/185.03

(58) Field of Classification Search .............. 365/185.03
See application file for complete search history.

(56) References Cited

U.S. PATENT DOCUMENTS 5,483,483 A 1/1996 Choi et al.
5,650,956 A 7/1997 Choi et al.
5,753,950 A * 5/1998 Kojima ......................... 257/315
5,814,853 A * 9/1998 Chen ............................. 257/315
6,744,675 B1 * 6/2004 Zheng et al. ............. 365/185.28
7,339,834 B2 * 3/2008 Lutze ....................... 365/185.28
2002/0008990 A1 * 1/2002 Satoh et al. .............. 365/185.03
2002/0036925 A1 3/2002 Tanzawa et al.
2004/0062072 A1 * 4/2004 Tanzawa ....................... 365/145
2004/0223392 A1 11/2004 Ikehashi
2004/0228179 A1 11/2004 Pagliato et al.
2005/0174868 A1 8/2005 Anzai et al.
2006/0050553 A1 * 3/2006 Yeh ......................... 365/185.01
2006/0152974 A1 7/2006 Bathul et al.

OTHER PUBLICATIONS

Byung, et al., Electron-beam Irradiation-Induced Gate Oxide Degradation, Journal of Applied Physics, vol. 88, No. 11, pp. 6731-6735, Dec. 1, 2000.

Lu, et al., Advanced Non-Volatile Memory Devices with Nano-Technology, Invited Talk for 15th International Conference on Ion Implementation Technology, 2004.

* cited by examiner

*Primary Examiner* — Anthan Tran
(74) *Attorney, Agent, or Firm* — Baker & McKenzie LLP

(57) ABSTRACT

A multi-Level Cell (MLC) can be used to store, for example, 4 bits per cell by storing two bits on each of two sides. Each side can store, e.g., four different current level states that can be determined by the number of holes injected into, e.g., nitride layer, during programming. As more holes are injected the current decreases for a given voltage. The current can be low, therefore, it can be advantageous in one embodiment to use a current amplifier. The current amplifier can be a BJT, MOS or other type of device.

26 Claims, 11 Drawing Sheets

SYSTEMS AND METHODS FOR PROGRAMMING A MEMORY DEVICE

APPLICATION FOR CLAIM OF PRIORITY

This application claims priority as a Divisional under 35 U.S.C. §120 and §121 to U.S. patent application Ser. No. 11/248,504 filed Oct. 12, 2005 and entitled "SYSTEMS AND METHODS FOR PROGRAMMING A MEMORY DEVICE." The disclosure of the above-identified application is incorporated herein by reference as if set forth in full

BACKGROUND

1. Field of the Invention

The present invention relates generally to semiconductor memory devices and more particularly to semiconductor memory devices that allow multiple bits per cell.

2. Background of the Invention

Band-to-band (BTB) PHINES memory cells are a type of memory cell that can store 2 bits per cell. One bit can be stored on the source side of the transistor and one bit can be stored on the drain side of the transistor. In these memory cells each bit can have two states; a high current state that can represent a logic "1" and a low current state that can represent a logic "0". Each side of the memory cell can be read by sensing the current through the cell and determining if the current is higher or lower than a threshold. Programming and reading BTB-PHINES memory cells will be discussed further with respect to FIG. 1A, which is a diagram illustrating an example BTB-PHINES memory cell 100, and FIG. 1B, which illustrates the sensing current for an erased and programmed cell.

Transistor 100 includes a silicon substrate 102 that is the base material that the rest of the memory device can be fabricated from. Two n+ regions 104 and 106 can be created by doping the silicon substrate. These regions 104 and 106 can act as source and drain for transistor 100. An ONO layer 108 can then be deposited on top of silicon substrate 102 between n+ regions 104 and 106 and a polysilicon layer (not shown) can be deposited on top of ONO layer 108 to form the gate of transistor 100. ONO layer 108 can include a nitride (n) layer 110 that traps charge, sandwiched between two silicon oxide layers.

Transistor 100 can be configured to store data. Data can be stored by "programming" and "erasing" a memory cell comprising transistor 100. In the erased state, a low number of "holes", i.e., less holes than electrons, are in nitride layer 110. When a low number of holes are present in nitride layer 110 more current flows through the transistor, e.g., from substrate to source or substrate to drain.

Programming of the memory cell is achieved by hot hole injection into nitride layer 110. As holes are injected into nitride layer 110 fewer and fewer electrons reside in layer 110. As fewer electrons remain in layer 110 less negative charge exists in layer 110. For this reason layer 110 exhibits more positive charge as more holes are injected into nitride layer 110. As nitride layer 110 becomes more and more positively charged it takes more negative voltage on the gate to get a given amount of current to flow. For this reason, as more holes are injected into nitride layer 110 less current flows for a given gate and drain or gate and source voltage. During program operation, holes are injected to compensate for, or recombine with, the stored electrons. Electrons and holes coexist in the memory cell. In the programmed state, the number of holes is more than the number of electrons. In the erased state, the number of electrons is more than the number of holes.

As described above, the BTB current of an erased cell is higher than the BTB current of a programmed cell. For this reason the state of each side of each cell, programmed or not programmed, can be determined by comparing the current through each side of each cell to a threshold, e.g., a substrate to drain or substrate to source current threshold.

In a PHINES memory device the charge accumulated on nitride layer 110 can be erased by a process known as Fowler-Nordheim Injection. During an erase cycle, erase voltages are applied to the source, drain, gate and body of transistor 100 that cause electrons to tunnel through the bottom or top oxide barrier of ONO layer 110 into the nitride layer. These electrons can compensate for the holes injected into nitride 110 layer during programming. The tunneling through the bottom or top oxide layer can occur in the presence of a high electric field, created as a result of application of the erase voltages to transistor 100, and is a form of quantum mechanical tunneling.

FIG. 1B is a graph illustrating the read operation of cell 100. As can be seen, during a read, a read voltage of 2 volts can be applied to source 106, while a −10 volt read voltage is applied to the gate and drain 104 is allowed to float. The resulting source current can then be monitored in order to determine whether cell 100 is programmed. If the cell is programmed, then the current will be low as illustrated in FIG. 1B. If, on the other hand, the cell is erased, then the current will be relatively high as illustrated in FIG. 1B The other side of cell 100 can be read by switching the drain and source voltages and monitoring the drain current.

Storing two bits per cell can increase memory density, however, application and data needs for electronic devices continues to grow, which continues to drive requirements for even greater densities than provided by conventional memory devices.

SUMMARY

A Multi-Level Cell (MLC) technique can be used to store, for example, 4 bits per PHINES cell by storing two bits on each of two sides, e.g. substrate to source or substrate to drain. Each side can store, e.g., four different charge states that can be determined by the number of holes injected into, e.g., a nitride layer, during programming.

In one aspect, a current amplifier can be used to detect the current levels associated with the different charge states. The current amplifier can be a BJT, MOS or other type of device.

In another aspect, multiple sensing voltages can be used to detect the different states. The current produced in response to the different sensing voltages can then be compared to a single reference level.

In another aspect, one sensing voltage can be used and the current generated can then be compared to multiple reference levels to detect the different states.

These and other features, aspects, and embodiments of the invention are described below in the section entitled "Detailed Description."

BRIEF DESCRIPTION OF THE DRAWINGS

For a more complete understanding of the invention, and the advantages thereof, reference is now made to the following descriptions taken in conjunction with the accompanying drawings, in which.

DETAILED DESCRIPTION

Figure 1A:
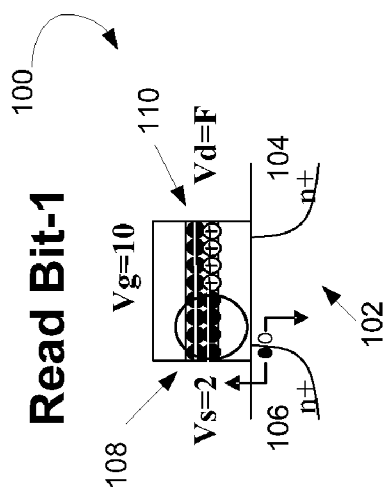
FIG. 1A is a diagram illustrating an example BTB-PHINES memory cell.
Figure 1B:
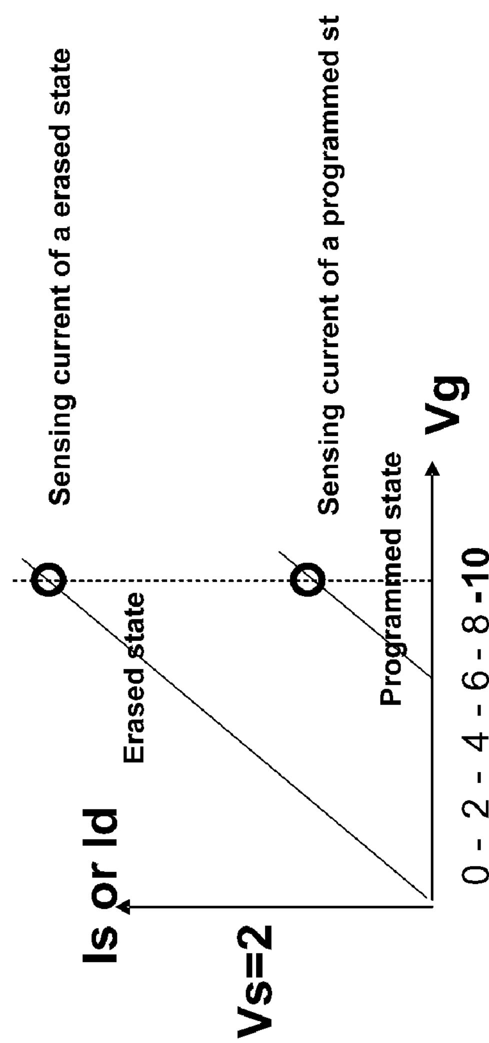
FIG. 1B is a graph illustrating the read operation of the cell of FIG. 1A.
Figure 2A:
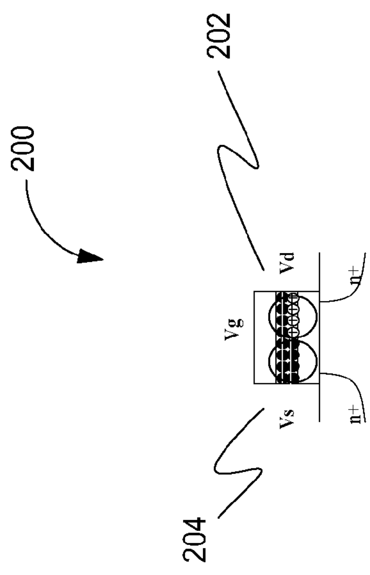
FIG. 2A is a diagram illustrating an example memory cell configured in accordance with one embodiment.

FIG. 2A is a diagram illustrating an example memory cell 200 configured in accordance with one embodiment of the systems and methods described herein. FIG. 2A includes an example memory cell 200 that can, for example, store 4-bits per cell by using a multi-level cell (MLC) configuration. MLC techniques take advantage of the ability to store multiple charge levels in the charge storage structure of a transistor cell. Each of these different levels can then be used to represent multiple bits within the cell. Thus, each cell can store more bits which increases the density and reduces the physical size.

A MLC can be created by varying the number of holes injected during programming and thereby varying the current that will flow for a given gate to drain or gate to source voltage; more holes injected during programming leads to lower current flow. As with the PHINES memory cell discussed above, different current levels can represent different logic states; however, the number of logic states can be extended through MLC.

In the embodiment of FIG. 2A, each memory cell 200 can have two storage sides 202 and 204 and each storage side 202 and 204 can, for example, store 4 different charge states generated by embedding charge at different states within the trapping layer. Each of the 4 different charge states can represent one of four different 2-bit patterns (11, 10, 00, 01). Accordingly, 2 bits can be stored in each storage side 202 and 204 and 4 bits can be stored in one memory cell 200.

Figure 2B:
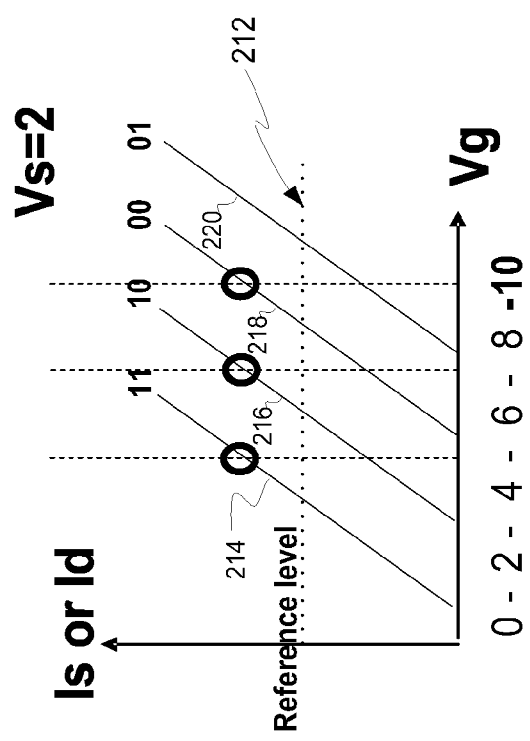
FIG. 2B is a graph illustrating the read operation of the cell of FIG. 2A in accordance with one embodiment.

FIG. 2B is a graph illustrating the source or drain currents for various gate voltages for the different charge states associated with memory cell 200. The Y-axis illustrates current, either source current or drain current (Is or Id) depending on which storage side 202 or 204 is being read. The X-axis illustrates the gate voltage (Vg) applied to transistor 200. A reference current threshold 212 can be set and for different gate voltages the level of current flow can be compared to threshold 212. Each charge state for transistor 200 will have a different current curve 214, 216, 218, and 220 as shown. For example, when a gate voltage of −6 volts is applied to the gate of transistor 200, the threshold voltage for the charge state associated with current curve 214 can be exceeded, causing enough current to flow that current threshold 212 is exceeded. This can represent logic state "11" as indicated. Similarly, a gate voltage of −8 volts can cause the threshold voltage for the next state, associated with current curve 216, to be exceeded such that the current is above threshold 212. This can represent logic state "10" as indicated. A gate voltage of −10 volts can cause the current for the next state, associated with current curve 218, to exceed threshold 212, which can represent logic state "00" as indicated. The state "01" can be indicated by current less than threshold 212 for each of the gate voltages −6V, −8V, and −10V. Alternatively, current above the threshold for −12V for one of the charge states can indicate a logic state "01."

Figure 3:
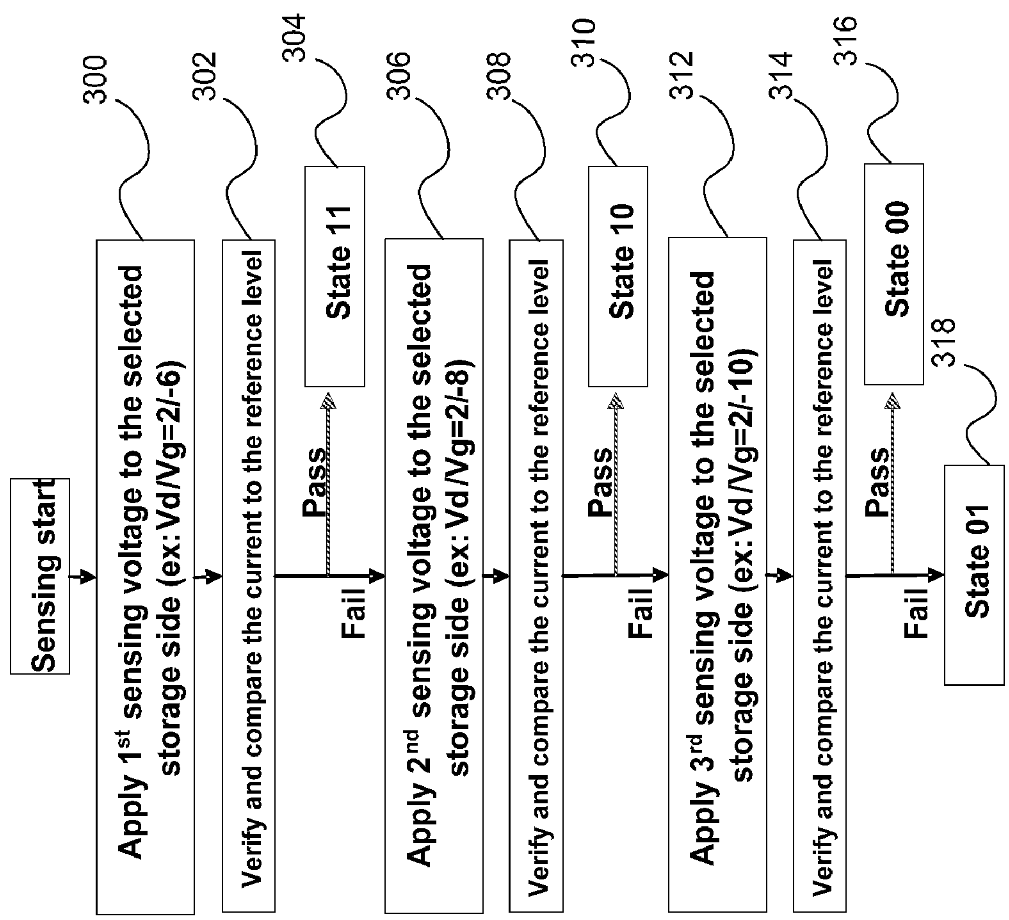
FIG. 3 is a flowchart illustrating an example method for reading the cell of FIG. 2A in accordance with the embodiment of FIG. 2B.

FIG. 3 is a flowchart illustrating an example method for sensing multiple bits using a single threshold and multiple gate voltages, such as illustrated in FIG. 2B, in accordance with one embodiment of the systems and methods described herein. As was described above, each gate voltage can be stepped through from, e.g., −6V to −10V and the resulting current can be compared to threshold 212. In step 300, a first sensing voltage can be applied to the selected storage side. Note that the drain side or the source side can be selected depending on which of the two storage sides of the memory cell are to be read.

As discussed above, generally, as voltage from gate to drain or gate to source increases the current from the drain to the substrate or source to substrate increases and as the number of holes injected during programming increases the current decreases. Therefore, as more holes are injected during programming, higher voltages are required during reading to get a current above a selected threshold.

In step 300, for example, a gate voltage of −6V can be used while a drain voltage of 2V can be used, e.g., when the drain side is selected to be read. When the drain side is selected to be read, the source side can either be allowed to float or be tied to ground. The current level can then be compared in step 302, to threshold 212 and if the current level is greater than threshold 212 then state "11" can be selected in step 304. Alternatively, in step 306, a second sensing voltage can be applied, for example, a gate voltage of −8 volts and a drain voltage of 2 volts.

The current level can then be compared in step 308, to threshold 212 and if the current level is greater than threshold 212 then state "10" can be selected in step 310.

In step 312 a third sensing voltage can be applied, for example, a gate voltage of −10V and a drain voltage of 2V. The current level can then be compared, in step 314, to threshold 212 and if the current level is greater than threshold 212 then state "00" can be selected in step 316. Alternatively, state "01" can be selected in step 318. As described above, a forth sensing voltage is not required, since, by process of elimination, the "01" state is the only state left that has not been tested for by applying each of the three sensing voltages. A fourth sensing voltage can be used if desired to, for example, verify the "01" state and perhaps eliminate some erroneous reads due to damaged or malfunctioning memory cells.

It will be understood that, while the example discussed with respect to FIG. 3 was discussed with reference to a drain voltage, the discussion can also be applicable to a source voltage, depending on which side 202 or 204 is selected to be read. Additionally, different gate, and/or drain voltages can be used depending on each implementation and, for example, the number of holes injected during the programming process. It will further be understood that, as discussed above, more than 4 bits can be stored if more than 4 different charge states are defined. For example, if 8 different charge states are defined, 3 bits per state can be stored. It will be understood, however, that as the number of charge states increase, the difference between each different current level can be diminished and the possibility of error can increase.

Figure 4:
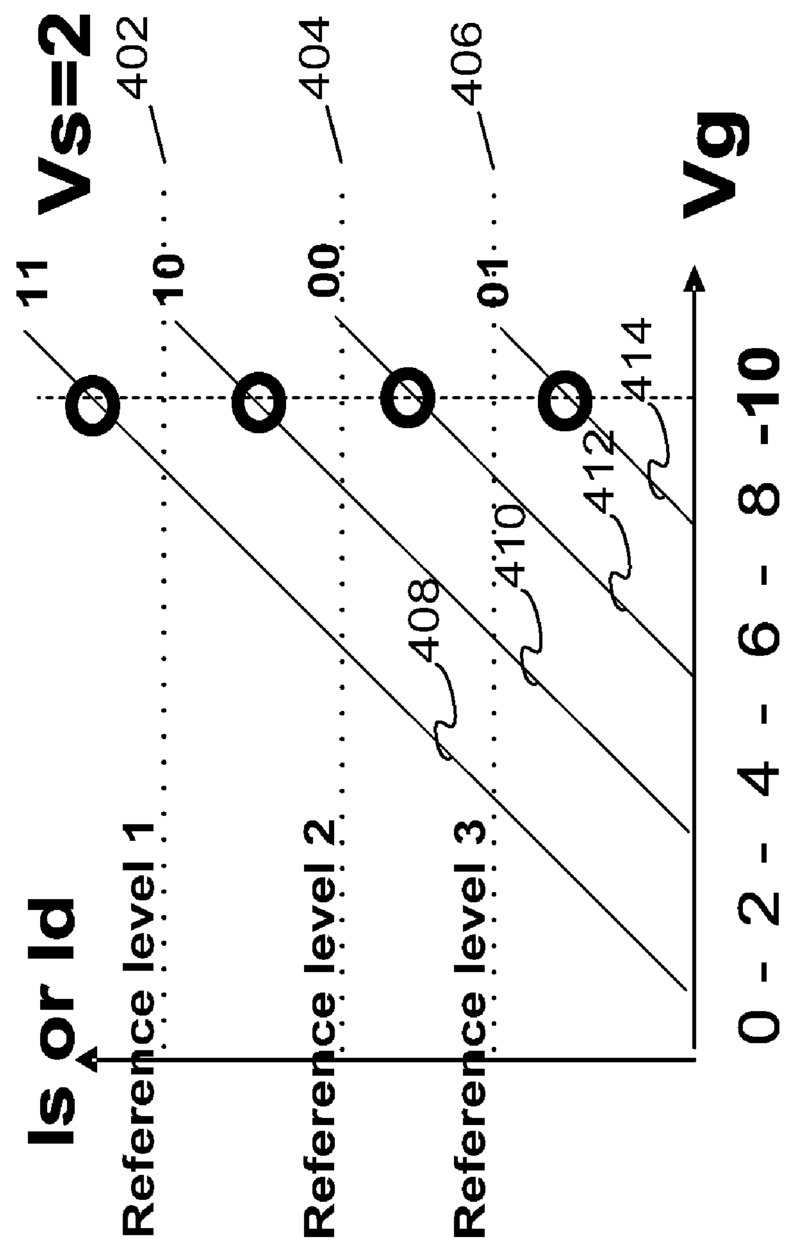
FIG. 4 is a graph illustrating the read operation of the cell of FIG. 2A in accordance with another embodiment.

FIG. 4 is a graph illustrating the source or drain currents for a single gate voltage for the different charge states associated with cell 200. In FIG. 2, previously discussed, threshold 212 was constant and the voltage applied to the gate was varied. Alternatively, as shown in FIG. 4, the gate voltage can be held constant, e.g., −10V, and multiple thresholds can be used to detect the charge states associated with cell 200. Thus, as illustrated, 3 thresholds 402, 404, and 406 can be used. Depending on the current level relative to these thresholds 402, 404, and 406 one of, e.g., four logic states can be detected. For example, logic state "11" can be detected when the current for one of the charge states, represented by curve 408, exceeds threshold 402. Alternatively, a logic level "10" can be detected when the current for the next charge state, represented by curve 410, exceeds threshold 404. A logic level "00" can be detected when the current for the next charge state represented by curve 412, exceeds threshold 406. As shown on the graph, current level for the last charge state represented by curve 414, is below each reference level 402, 404, and 406. This can be detected as a "01." It will be understood that the bit pattern, "00", "01", "10", "11" associated with each state can be varied in different implementations.

Figure 5:
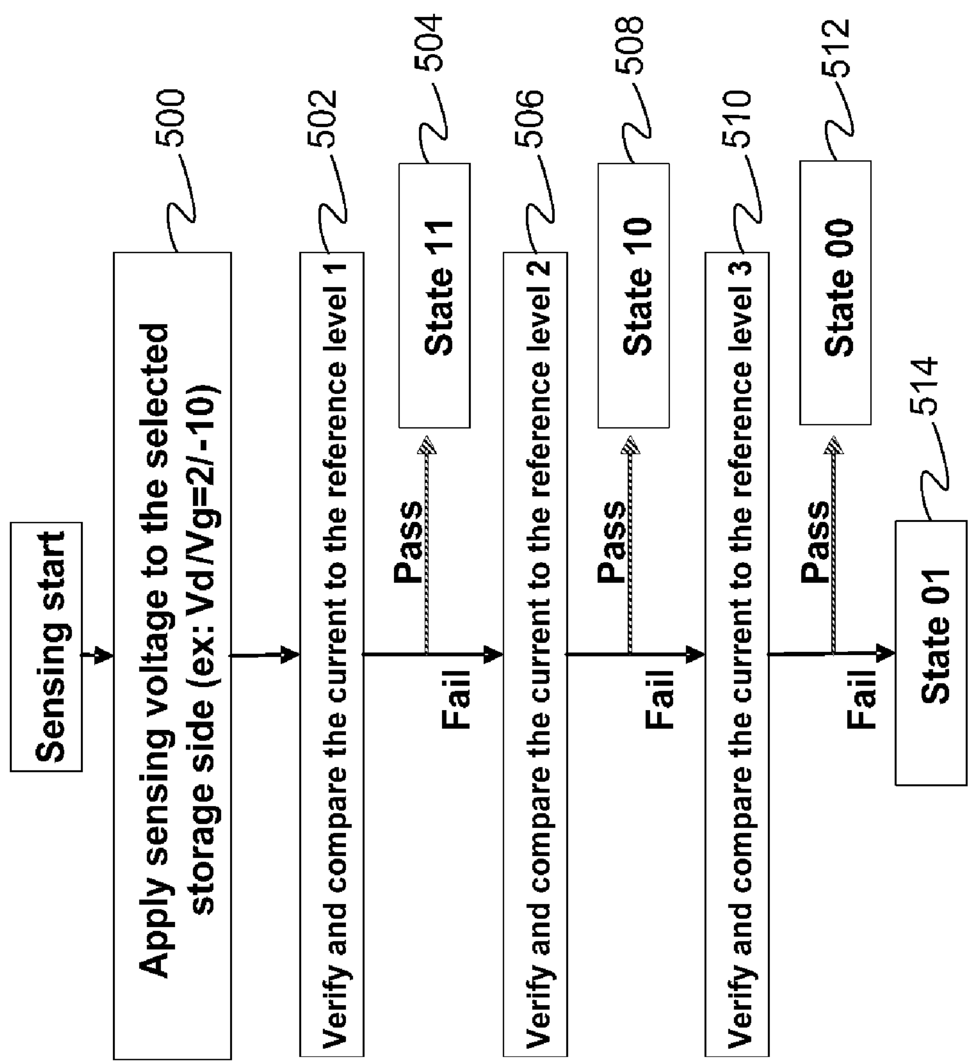
FIG. 5 is a diagram illustrating an example method for reading the cell of FIG. 2A in accordance with the embodiment of FIG. 4.

FIG. 5 is a flowchart illustrating an example method for sensing multiple bits using a single read voltage, as in the example of FIG. 4, in accordance with one embodiment of the systems and methods described herein. A sensing voltage can be applied to the selected storage side in step 500. For example, a gate voltage of −10V can be applied and a drain voltage of 2V can be applied. In this example, as described above, the sensing voltage applied can be held constant and the current can be compared to multiple thresholds. For example, in step 502 the current level can be compared to reference level 1. If the current level is greater than reference level 1 then logic state "11" can be selected in step 504. Alternatively, in step 506 the current level can be compared to reference level 2 and if the current level is greater than reference level 2, then logic state "10" can be selected in step 508.

In step 510 the current level can be compared to reference level 3 and if it is greater than reference level 3 then logic state "00" can be selected. Alternatively, logic level "01" can be selected. Recall that a fourth reference level is not required since the "01" state can be selected by eliminating the other three states as possibilities.

Figure 6:
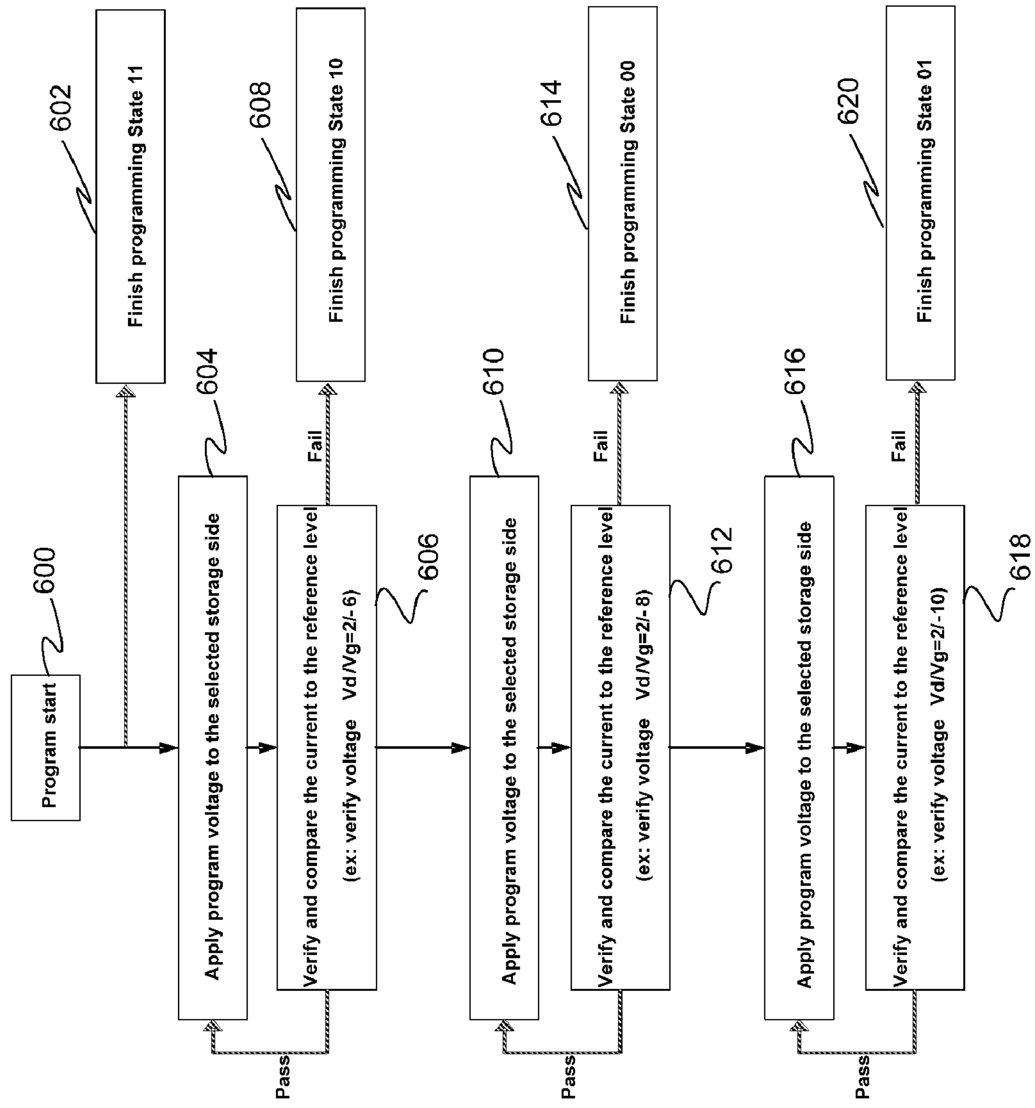
FIG. 6 is a flowchart illustrating an example method for programming the cell of FIG. 2A in accordance with one embodiment.

FIG. 6 is a flowchart illustrating an example programming method in accordance with one embodiment of the systems and methods described herein. The flowchart begins at step 600. Recall that, generally, as voltage from gate to drain or gate to source increases the current from the drain to the substrate or source to substrate increases and as the number of holes injected during programming increases the current decreases. Therefore, as more holes are injected during programming, higher voltages are required during reading to get a current above a selected threshold.

One possible state can be the fewest possible holes, ideally, no holes. In this state, generally, the most current will flow for a given combination of gate to drain or gate to source voltages. This state can represent a logic "11" state as illustrated by step 602. Alternatively, a program voltage can be applied to the gate, drain, source and body of transistor 200. When the appropriate programming voltages are applied, holes are injected to the charge storing nitride layer in one side of the ONO layer of the memory cell. Recall that the memory cell can have, e.g., two storage sides 202 and 204. Holes can be injected into the nitride layer of the memory cell until enough holes are injected that the current level resulting during application of the appropriate read voltage will be above or below a reference level that represents logic state "10" in step 606. If this is the desired logic state then the programming can be complete in step 608.

Alternatively, in step 610 the program voltage can be applied to the memory cell. More holes can be injected into the nitride layer until the current level reaches a level that will result in a read current that is above or below the threshold for a logic state "00" in step 612. If logic state "00" is the desired logic state then the programming can be complete in step 614. Alternatively, the process can be repeated in step 616 until enough charge is stored that the resulting read current level will be above or below the threshold for a logic "01" in step 618. The programming of this memory cell can then be complete in step 620 with a logic state of "01" stored in the memory cell.

While the process shown in FIG. 6 has been broken into several steps, it will be understood that a program process can occur as fewer steps. For example, apply program voltage until desired current level is reached, and then remove program voltage. Further, it will be understood that FIG. 6 is one example of a multiple bit per cell programming method.

Figure 7:
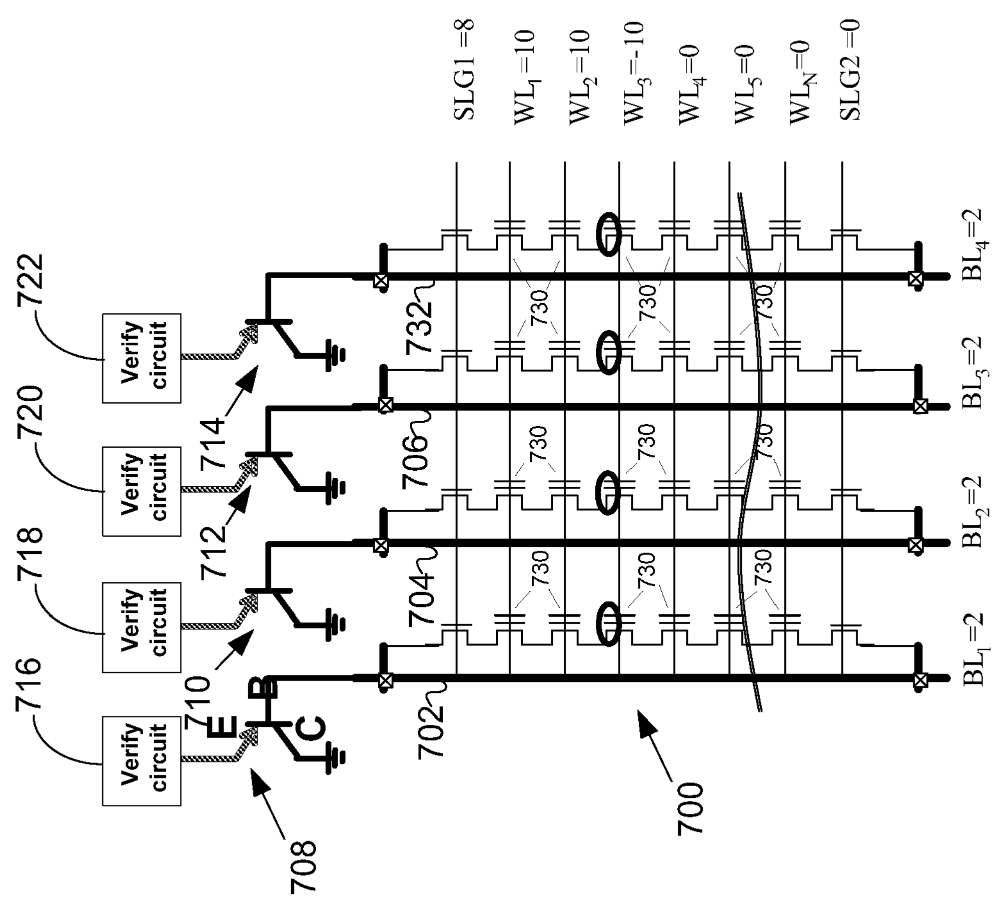
FIG. 7 is a diagram illustrating an example current amplifier that can be included in a memory device that includes the cell of FIG. 2A configured in accordance with one embodiment.

As mentioned above, because multiple current levels will need to be detected, some of the levels can be relatively low. Accordingly, a sense amplifier can be used to aid in the detection of the current levels. FIG. 7 is a diagram illustrating a memory device 700 that includes a plurality of memory cell transistors 730 that can be configured in accordance with the systems and methods described above. In addition, memory device 700 can include a plurality of current amplifiers 708-714 that can be configured to amplify the sense currents produced by transistor 730. Not only can the current through the transistor 730 be low, the difference in current between each of the multiple states for each transistor 730 can also be very minute. In other words, the current window for each state is reduced relative to conventional devices.

For these reasons, it can be useful to add a current amplifier to amplify the current to be detected. In one example each of several groups of memory cells can be connected to one of current amplifiers 708, 710, 712, and 714 via sense lines 702, 704, 706 and 732. As can be seen, each current amplifier 708-714 comprises a BJT transistor with its base connected to one of sense lines 702, 704, 706 and 732, and its collector grounded. A low current through the base of the transistor of each current amplifier 708, 710, 712, and 714 causes a much larger current to flow through the emitter to the collector of that transistor. This larger current can be measured by the verification circuit 716, 718, 720, and 722 connected with current amplifiers 708, 710, 712, and 714 respectively.

Figure 8:
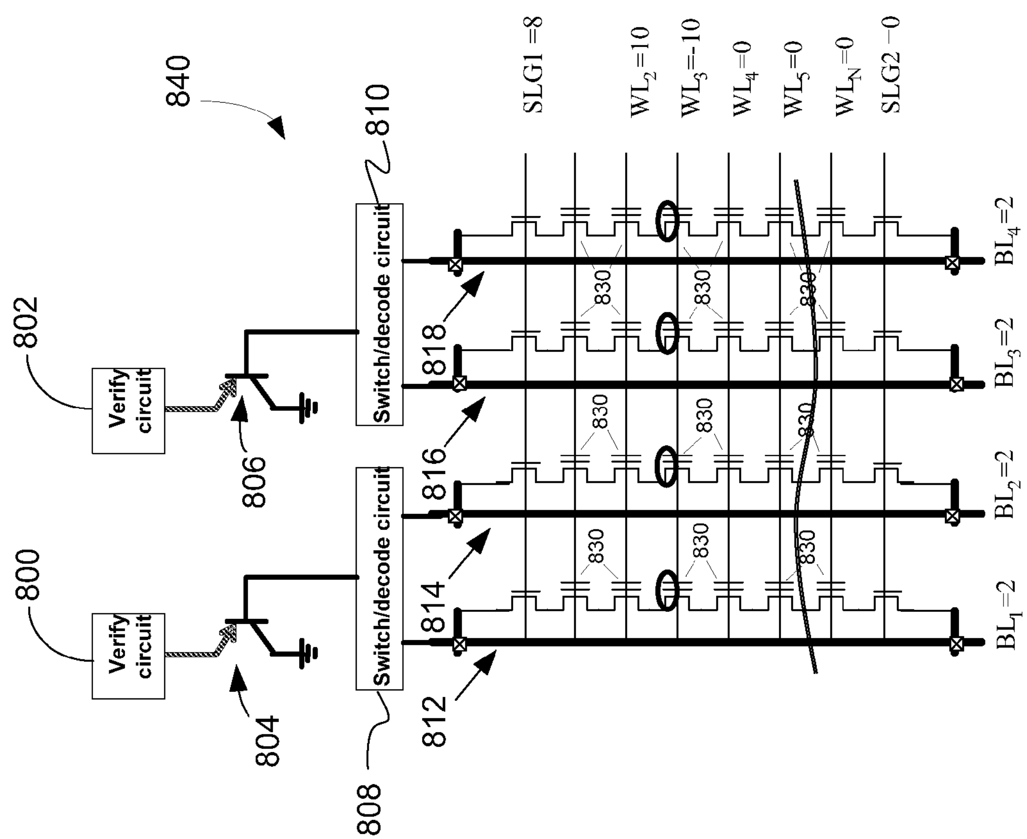
FIG. 8 is a diagram illustrating an example current amplifier that can be included in a memory device that includes the cell of FIG. 2A configured in accordance with another embodiment.

FIG. 8 is a diagram illustrating an example memory device 840 comprising a plurality of memory cells 830 that can be configured in accordance with the systems and methods described above. Memory device 840 can also include current amplifiers 804 and 806 configured in accordance with another embodiment of the systems and methods described herein. Unlike the embodiment of FIG. 7, the number of verification circuits 800 and 802 and current amplifiers 804 and 806 can be decreased if decode circuits 808 and 810 are used. Decode circuits 808 and 810 select which sense lines 812, 814, 816, and 818 can be read. For example, Decode circuit 808 can select between sense lines 812 and 814.

Figure 9:
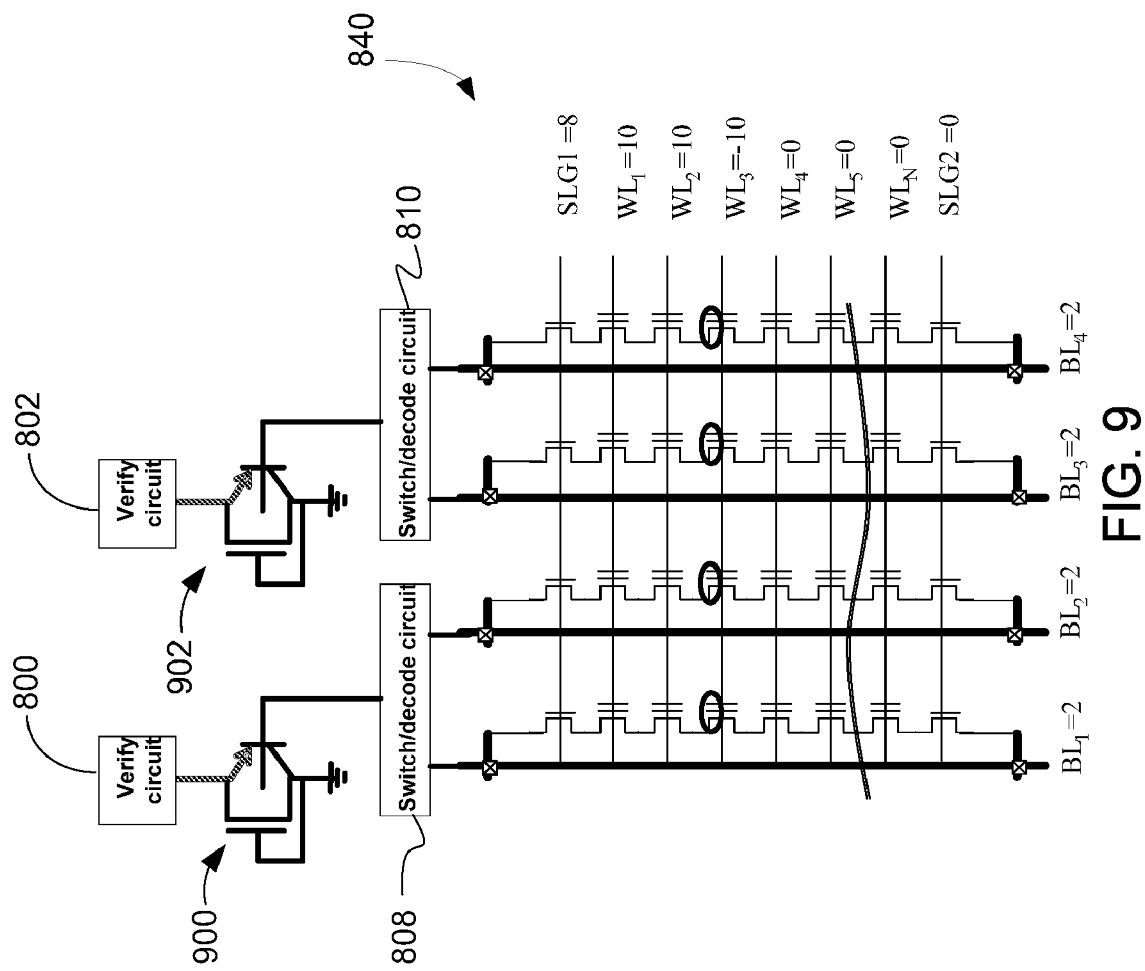
FIG. 9 is a diagram illustrating an example current amplifier that can be included in a memory device that includes the cell of FIG. 2A configured in accordance with still another embodiment.
Figure 10:
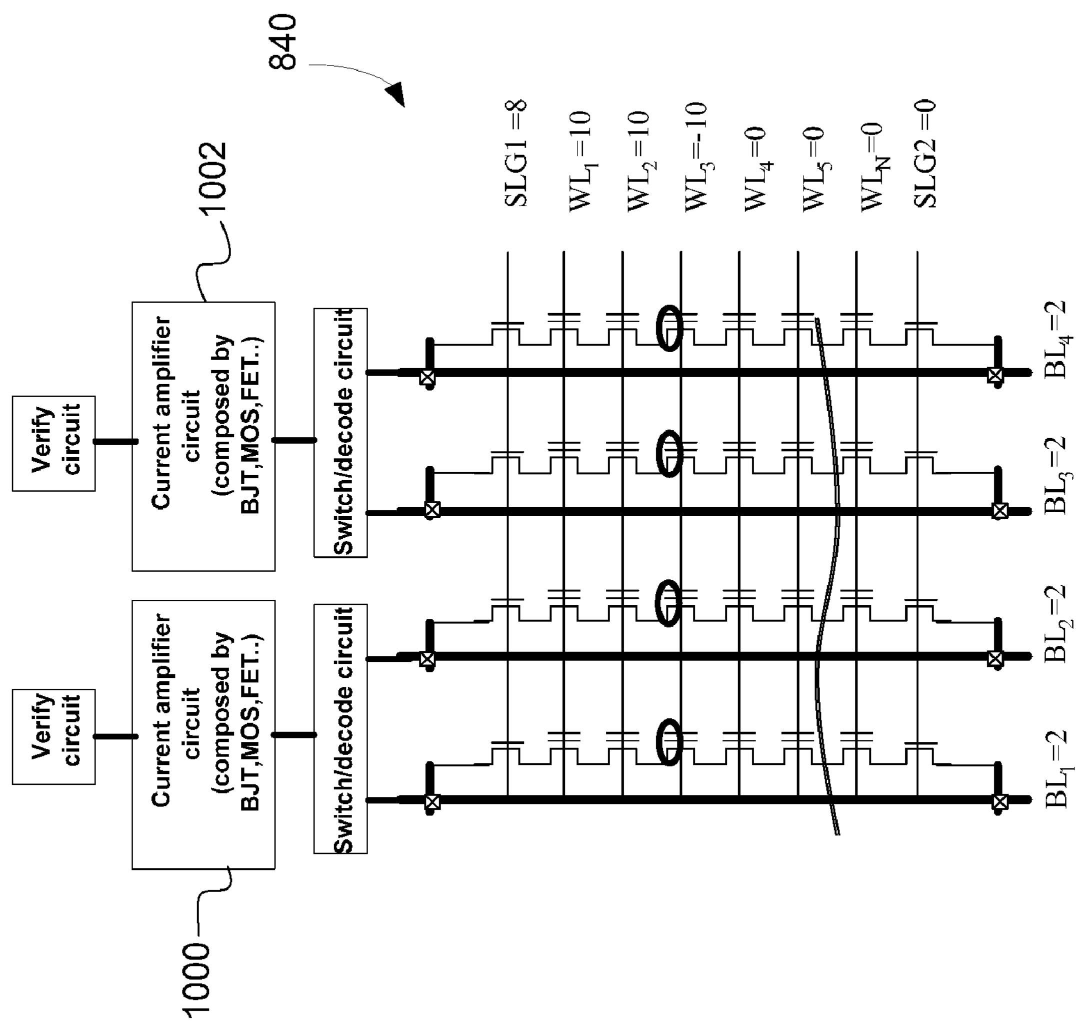
FIG. 10 is a diagram illustrating an example current amplifier that can be included in a memory device that includes the cell of FIG. 2A configured in accordance with still another embodiment.

In the embodiment of FIG. 8, amplifiers 804 and 806 use BJT transistors as in the embodiment of FIG. 7. Alternatively, FIG. 9 is a diagram illustrating an example embodiment in which current amplifiers that use MOS transistors 900 and 902 are used. In general, it will be understood that many different types of transistors can be used in accordance with the systems and methods described herein. Thus, the embodiments of FIGS. 7-9 should not be seen as limiting the systems and methods described herein to any particular amplifiers configuration or type. Thus, as illustrated in FIG. 10, any type of current amplifiers that can be used to differentiate between the currents associated with the different states stored in the memory cells can be used in conjunction with the systems and methods described herein. Accordingly, current amplifiers 1000 and 1002 can comprise one or more BJT transistors, MOS transistors, FET transistors, etc.

Figure 11:
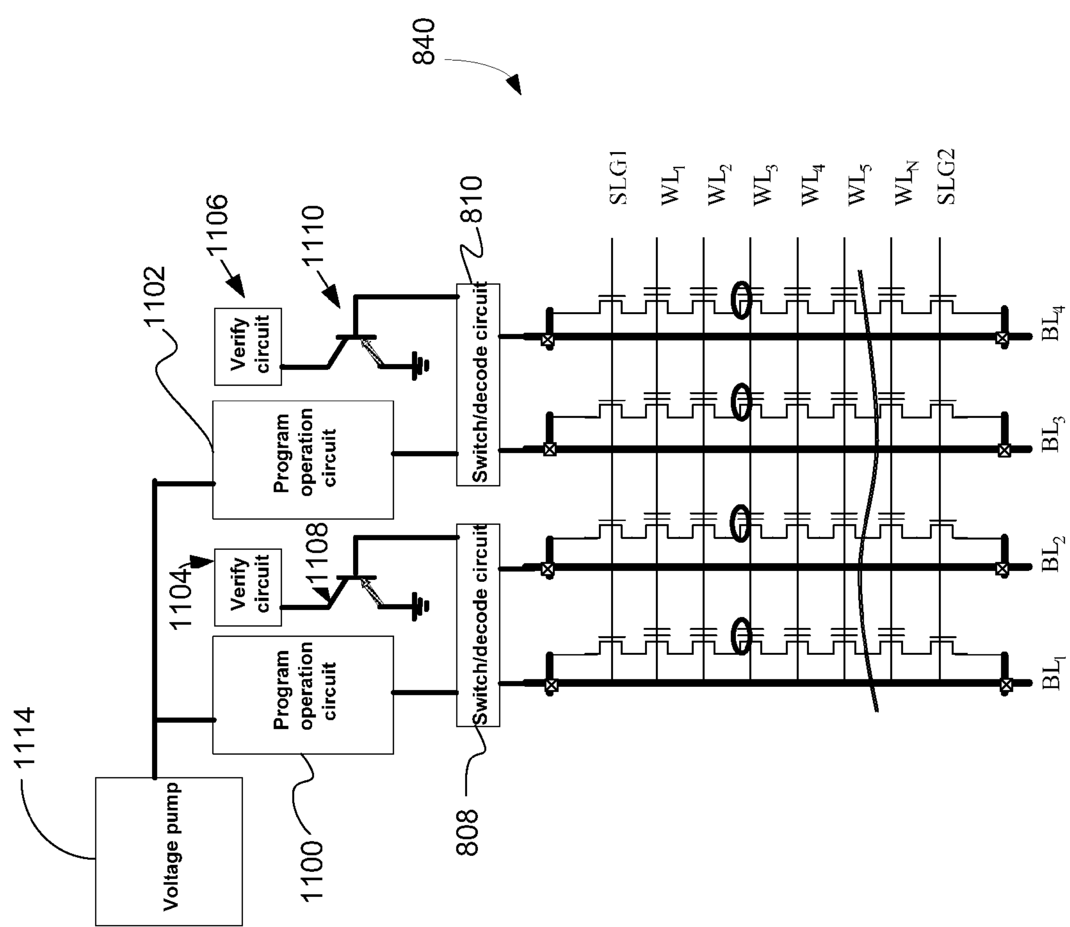
FIG. 11 is a diagram illustrating an example programming and sensing circuit that can be included in a memory device that includes the cell of FIG. 2A configured in accordance with still another embodiment.

Amplifiers, such as amplifiers 1000 and 1002 are good for reading and erasing, but are generally not useable for programming memory device 840. Thus, some type of switch can be used to switch between amplifiers for amplifying sense current generated by device 840 and programming circuits used to program device 840. For example, FIG. 11 is a diagram illustrating an example programming circuit configured to program the cells of memory device 840 in accordance with one embodiment of the systems and methods as described herein. The programming circuits can be selectively coupled with the cells of array 840 via a switch, which can also be configured to selectively couple sense amplifiers that can be used to amplify sense currents generated for the cells of device 840. Thus, during programming operations, the programming circuits can be coupled with the cells, and during read and/or erase operations, the sense amplifiers can be interfaced with the cells of device 840.

The programming circuit can comprise a voltage pump 1114 configure to supply a voltage. The circuit can also comprise one or more programming circuits, such as programming circuits 1100 and 1102. Programming circuits 1100 and 1102 can be configured to program the cells to which they are attached, e.g., via decoder, or switch, circuits 808 and 810 in order to program each cell the appropriate state. In other words, programming circuits 1100 and 1102 can be configured to implement the method of FIG. 6.

Amplifiers 1108 and 1110 and verify circuits 1104 and 1106 can be used to verify that the cells are programmed to the appropriate state. Amplifiers 1108 and 1110 can generally be used to amplify read and/or erase currents produced from the cells of device 840.

It should be noted that in certain embodiments there can be a single programming circuit for each sense, or bit line. Thus, it will be understood that the circuit of FIG. 11 is by way of example and that other configurations are possible.

While certain embodiments of the inventions have been described above, it will be understood that the embodiments described are by way of example only. Accordingly, the inventions should not be limited based on the described embodiments. Rather, the scope of the inventions described herein should only be limited in light of the claims that follow when taken in conjunction with the above description and accompanying drawings.

What is claimed is:

1. A method for programming a memory cell, comprising:

providing a circuit unit performing steps, including:

selecting a hole injection-type memory cell having a source and drain, wherein the source is operable to allow current to flow between the source and a substrate and is operable to store bits, and wherein the drain is operable to allow current to flow between the drain and the substrate and is operable to store bits;

selecting a charge state from a plurality of charge states for programming the selected memory cell;

applying a programming voltage to the selected memory cell;

providing an amplifier unit coupled to the hole injection-type memory cell and configured to amplify a sense current, wherein the sense current is generated by current flow from the substrate to one of the source and the drain of coupled to the hole injection-type memory cell, wherein the current flow is between the substrate and only the one of the source and the drain of the hole injection-type memory cell; and checking the amplified sense current for the selected memory cell and comparing the amplified sense current to a threshold to verify that the selected hole injection-type memory cell has as been programmed to the selected charge state.

2. The method of claim 1, further comprising selecting a threshold for verification associated with the selected charge state.

3. The method of claim 2, wherein the amplifier unit comprises a BJT amplifier device.

4. The method of claim 2, wherein the amplifier unit comprises a MOS amplifier device.

5. The method of claim 2, wherein the amplifier unit comprises a FET amplifier device.

6. The method of claim 2, wherein the programming voltage is controlled by a programming circuit coupled to the hole injection-type memory cell.

7. The method of claim 6, further comprising:

providing a switch, coupled to the hole injection-type memory cell, the amplifier unit, and the programming circuit.

8. The method of claim 7, wherein the switch is configured to couple the amplifier unit with the hole injection-type memory cell when the hole injection-type memory cell is being read.

9. The method of claim 7, wherein the switch is configured to couple the programming circuit with the hole injection-type memory cell when the hole injection-type memory cell is being programmed.

10. The method of claim 1, further comprising determining that the selected side has not been programmed to the selected charge state and continuing to apply the programming voltage until the selected side is programmed to the selected charge state.

11. A method for reading a memory cell, comprising:

selecting a hole injection-type memory cell having a source, drain, and gate, wherein the source is operable to allow current to flow between the source and a substrate and is operable to store bits, and wherein the drain is operable to allow current to flow between the drain and the substrate and is operable to store bits;

applying a plurality of sensing voltages to the gate of the hole injection-type memory cell;

sensing the current from the source or the drain for each of the plurality of sensing voltages applied to the gate of the selected hole injection-type memory cell, wherein the sensed current is generated by current flow from the substrate to one of the source and drain, wherein the current flow is between the substrate and only the one of the source and the drain of the hole injection memory cell;

amplifying one or more of the sensed current;

comparing the amplified sensed current to a threshold; and determining charge state of the selected hole injection-type memory cell based on the comparison of the amplified sensed current to the threshold.

12. The method of claim 11, wherein three sensing voltages are used to determine the charge state from four charge states of the selected hole injection-type memory cell.

13. The method of claim 11, wherein seven sensing voltages are used to determine the charge state from eight charge states of the selected hole injection-type memory cell.

14. The method of claim 11, wherein the memory cell is configured to generate the sense current in response to the plurality of sensing voltages applied to the hole injection-type memory cell.

15. The method of 11, further comprising:

providing an amplifier unit, coupled to the hole injection-type memory cell, the amplifier unit configured to amplify the sense current.

16. The method of claim 15, wherein the amplifier unit comprises a BJT amplifier device.

17. The method of claim 15, wherein the amplifier unit comprises a MOS amplifier device.

18. The method of claim 15, wherein the amplifier unit comprises a FET amplifier device.

19. The method of claim 15, further comprising:

providing a programming circuit; and providing a switch, coupled to the hole injection-type memory cell, the amplifier unit, and the programming circuit.

20. The method of claim 19, wherein the switch is configured to couple the amplifier unit with the hole injection-type memory cell when the memory cell is being read.

21. The method of claim 19, wherein the switch is configured to couple the programming circuit with the hole injection-type memory cell when the memory cell is being programmed.

22. A method for reading a memory cell, comprising:

selecting a hole injection-type memory cell having a source and drain, wherein the source is operable to allow current to flow between the source and a substrate and is operable to store bits, and wherein the drain is operable to allow current to flow between the drain and the substrate and is operable to store bits;

applying a sensing voltage to the hole injection-type memory cell;

sensing a current from the selected hole injection-type memory cell;

amplifying the sensed current;

comparing the amplified sensed current to at least one of a plurality of thresholds; and determining a charge state of the selected hole injection-type memory cell, wherein the sensed current is generated by current flow from the substrate to one of the source and the drain, wherein the current flow is between the substrate and only the one of the source and the drain of the hole injection-type memory cell.

23. The method of claim 22, wherein three thresholds are used to determine the charge state from four charge states of the selected hole injection-type memory cell.

24. The method of claim 22, wherein seven thresholds are used to determine the charge state from eight charge states of the selected hole injection-type memory cell.

25. The method of claim 22, further comprising:

providing a verification circuit, configured to check the sensed current and to compare the sensed current with at least on of the plurality of thresholds to verify that the selected hole injection-type memory cell as been programmed to the selected charge state.

26. The method of claim 25, wherein the verification circuit is further configured to select the threshold associated with the selected charge state for verification.

* * * * *